US012136538B2

United States Patent
Li et al.

(10) Patent No.: US 12,136,538 B2
(45) Date of Patent: Nov. 5, 2024

(54) DEPOSITION CHAMBER SYSTEM DIFFUSER WITH INCREASED POWER EFFICIENCY

(71) Applicant: Applied Materials, Inc., Santa Clara, CA (US)

(72) Inventors: Changling Li, Santa Clara, CA (US); Lai Zhao, Campbell, CA (US); Gaku Furuta, Sunnyvale, CA (US); Soo Young Choi, Fremont, CA (US); Robin L. Tiner, Santa Cruz, CA (US); David Atchley, Livermore, CA (US); Ganesh Babu Chandrasekaran, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 441 days.

(21) Appl. No.: 17/505,194

(22) Filed: Oct. 19, 2021

(65) Prior Publication Data
US 2023/0122134 A1    Apr. 20, 2023

(51) Int. Cl.
| | |
|---|---|
| *H01J 37/32* | (2006.01) |
| *B23B 35/00* | (2006.01) |
| *C23C 16/455* | (2006.01) |
| *C23C 16/50* | (2006.01) |

(52) U.S. Cl.
CPC .......... *H01J 37/3244* (2013.01); *B23B 35/00* (2013.01); *C23C 16/45565* (2013.01); *C23C 16/50* (2013.01); *H01J 2237/3321* (2013.01)

(58) Field of Classification Search
None
See application file for complete search history.

(56) References Cited

U.S. PATENT DOCUMENTS

| | | |
|---|---|---|
| 7,785,672 B2 | 8/2010 | Choi et al. |
| 8,074,599 B2 | 12/2011 | Choi et al. |
| 8,114,484 B2 | 2/2012 | Yang et al. |
| 8,142,606 B2 | 3/2012 | Choi et al. |
| 8,795,793 B2 | 8/2014 | Choi et al. |

(Continued)

FOREIGN PATENT DOCUMENTS

| | | | |
|---|---|---|---|
| WO | 2006017136 A2 | 2/2006 | |
| WO | WO-2015016980 A1 * | 2/2015 | ....... C23C 16/45536 |

OTHER PUBLICATIONS

Zhai, Yuhao, et al., Proceedings of the International Display Workshops, vol. 27, 2020, "Influence of Hollow Cathode Gradient Diffuser in PE-CVD for SiO2 on Performance and Reliability of IGZO TFTs", 4 pages.

*Primary Examiner* — Binu Thomas
(74) *Attorney, Agent, or Firm* — Lowenstein Sandler LLP

(57) ABSTRACT

A diffuser includes a front-side gradient surface formed from a diffuser block, a back-side gradient surface formed from the diffuser block, and opening structures formed from the front-side gradient surface to the back-side gradient surface. Each opening structure includes a conical opening having a first end along the front-side gradient surface and a second end corresponding to an apex at a depth within the diffuser block, and a cylindrical opening formed from the depth to the back-side gradient surface. The opening structures are arranged in rows including a first set of rows and a second set of rows alternately positioned along a length of the diffuser block.

15 Claims, 7 Drawing Sheets

(56) References Cited

U.S. PATENT DOCUMENTS

| | | | |
|---|---|---|---|
| 2005/0223986 A1* | 10/2005 | Choi | C23C 16/45565 118/715 |
| 2005/0251990 A1* | 11/2005 | Choi | C23C 16/45565 118/715 |
| 2005/0255257 A1* | 11/2005 | Choi | C23C 16/45565 118/715 |
| 2008/0302303 A1* | 12/2008 | Choi | C23C 16/45565 118/723 R |
| 2009/0000551 A1 | 1/2009 | Choi et al. | |
| 2012/0103264 A1 | 5/2012 | Choi et al. | |
| 2016/0225933 A1* | 8/2016 | You | C23C 16/45565 |

* cited by examiner

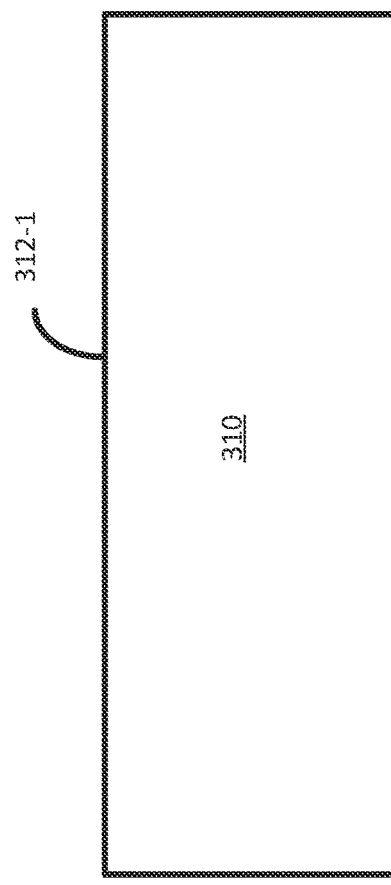
FIG. 3A
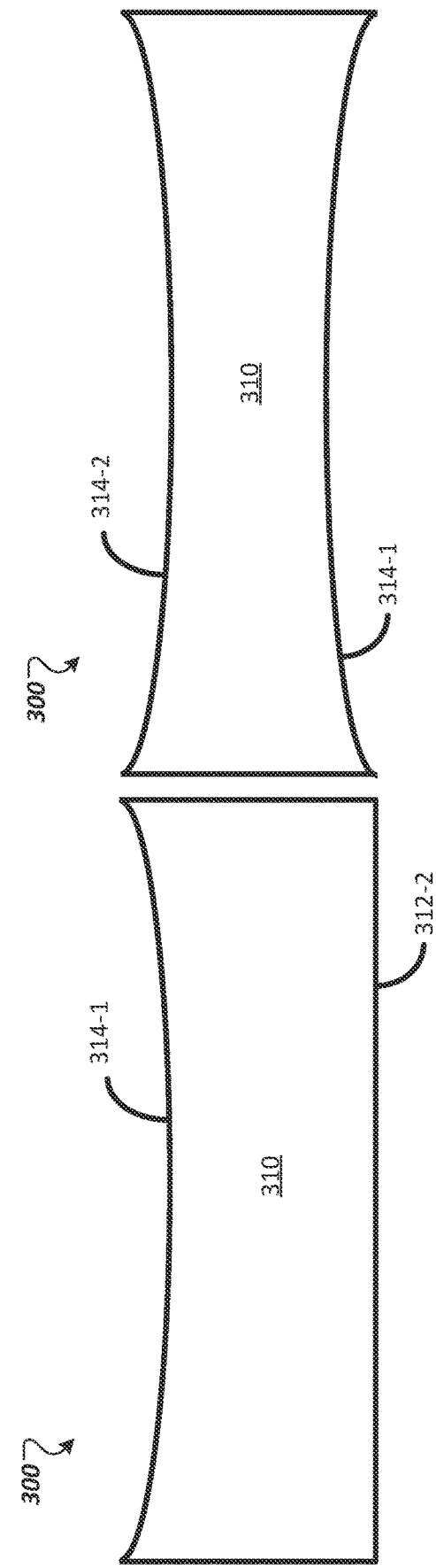
FIG. 3B
FIG. 3C

DEPOSITION CHAMBER SYSTEM DIFFUSER WITH INCREASED POWER EFFICIENCY

TECHNICAL FIELD

The instant specification generally relates to electronic device fabrication. More specifically, the instant specification relates to deposition chamber system diffusers with increased power efficiency.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together.

Process chambers may be used in an electronic device manufacturing apparatus to perform one or more processes on substrates, such as deposition processes and etch processes. For many processes gases are flowed into the process chamber. Traditionally, the flow of process gases into process chambers is non-uniform. Such non-uniformity in the gas flow can cause some regions of substrates to be exposed to more process gases than other regions of the substrates. As a result, films resulting from the deposition and/or etch processes may be non-uniform.

SUMMARY

In accordance with an embodiment, a diffuser is provided. The diffuser includes a front-side gradient surface formed from a diffuser block, a back-side gradient surface formed from the diffuser block, and a plurality of opening structures formed from the front-side gradient surface to the back-side gradient surface. Each opening structure of the plurality of opening structures includes a conical opening having a first end along the front-side gradient surface and a second end corresponding to an apex at a depth within the diffuser block, and a cylindrical opening of approximately constant diameter formed from the depth to the back-side gradient surface. The conical opening has a respective conical length defined by the front-side gradient surface, and the cylindrical opening has a respective cylindrical length defined by the back-side gradient surface. The plurality of opening structures is arranged in a plurality of rows including a first set of rows and a second set of rows alternately positioned along a length of the diffuser block. The first set of rows includes a first row having a first opening structure and a second opening structure separated by a first distance measured between centers of the first and second opening structures. The second set of rows includes a second row having a third opening structure separated from the first opening structure by a second distance measured between centers of the first and third opening structures.

In accordance with another embodiment, a deposition chamber system is provided. The deposition chamber system includes a processing chamber, at least one gas source, and a diffuser disposed within the processing chamber to receive a gas flow from the at least one gas source. The diffuser includes a front-side gradient surface corresponding to first concave surface formed from a diffuser block, a back-side gradient surface corresponding to a second concave surface formed from the diffuser block, and a plurality of opening structures formed from the front-side gradient surface to the back-side gradient surface. Each opening structure of the plurality of opening structures includes a conical opening having a first end along the front-side gradient surface and a second end corresponding to an apex at a depth within the diffuser block, and a cylindrical opening of approximately constant diameter formed from the depth to the back-side gradient surface. The conical opening has a respective conical length defined by the front-side gradient surface, and the cylindrical opening has a respective cylindrical length defined by the back-side gradient surface. The plurality of opening structures is arranged in a plurality of rows including a first set of rows and a second set of rows alternately positioned along a length of the diffuser block. The first set of rows includes a first row having a first opening structure and a second opening structure separated by a first distance measured between centers of the first and second opening structures. The second set of rows includes a second row having a third opening structure separated from the first opening structure by a second distance measured between centers of the first and third opening structures.

In accordance with yet another embodiment, a method is provided. The method includes removing material from a first side of a diffuser block to form a back-side gradient surface of a diffuser, wherein the back-side gradient surface is a first concave surface, after removing the material from the first side, removing material from a second side of the diffuser block to form a front-side gradient surface of the diffuser, wherein the front-side gradient surface is a second concave surface, and forming a plurality of opening structures through the front-side gradient surface to the back-side gradient surface.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

FIGS. 3A-3E are cross-sectional views illustrating an example process flow for fabricating a diffuser, in accordance with some embodiments.

DETAILED DESCRIPTION

Figure 1:
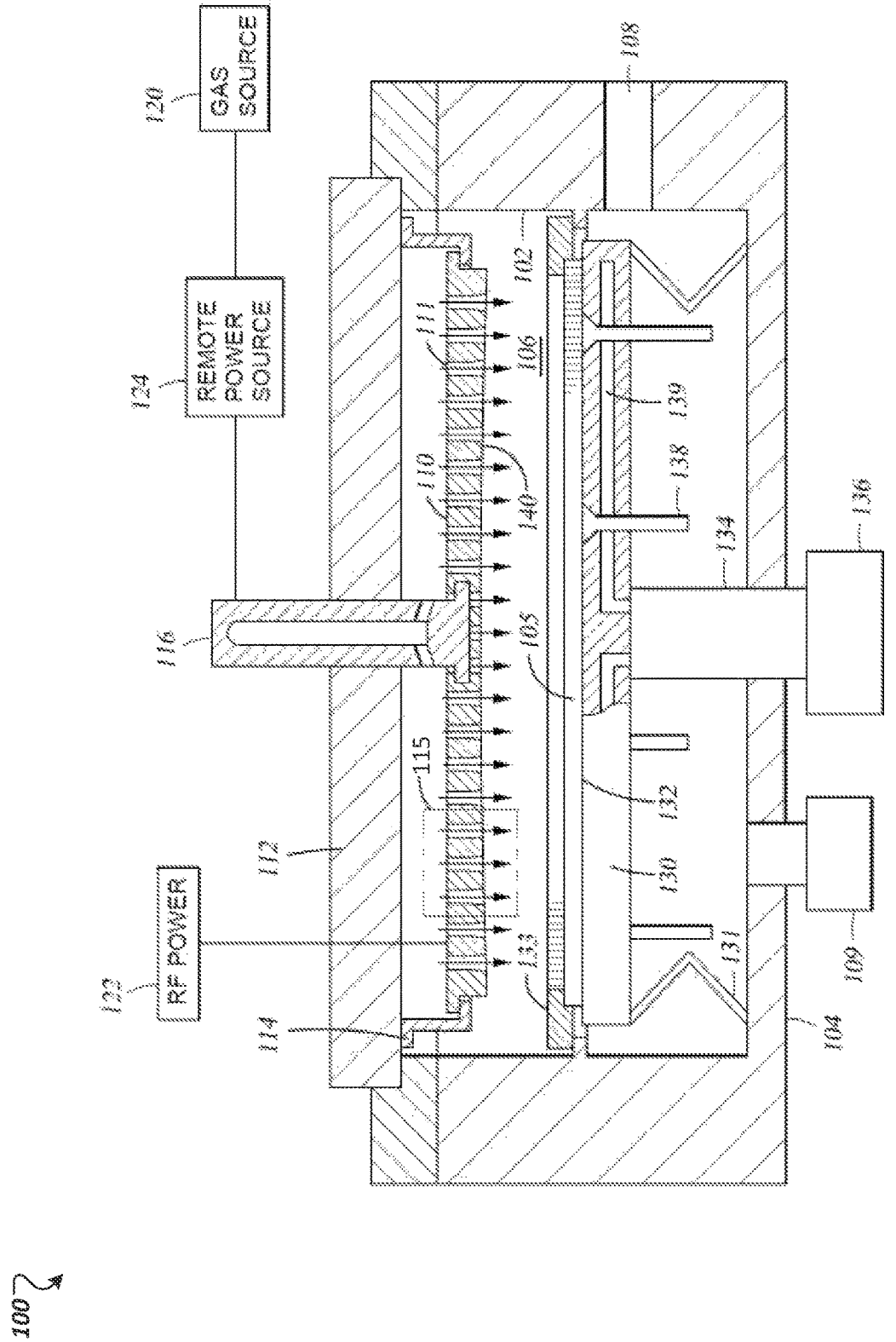
FIG. 1 is cross-sectional view of an example deposition chamber system, in accordance with some embodiments.

Processes for fabrication of electronic devices (e.g., semiconductor devices) generally include deposition of material (e.g., one or more thin film layers) on a substrate or wafer, and processing of the material. Deposition chamber systems, such as chemical vapor deposition (CVD) chamber systems, utilize process gases to perform a deposition process to deposit the material onto a substrate. Examples of CVD deposition processes include plasma enhanced (PE) CVD, thermally enhanced (TE) CVD, high density plasma (HDP) CVD, etc. To perform such CVD deposition processes, a substrate or wafer can be placed within a reactor chamber, and chemical vapors can be introduced into the reactor chamber that cause deposition of a particular material. For example, the particular material can be a dielectric material. One example of a dielectric material that can be deposited using a deposition process is a silicon oxide ($SiO_x$).

Liquid crystal displays or flat panels are commonly used for active matrix displays such as computer monitors and television monitors. PECVD is generally employed to deposit thin films on a substrate, such as a transparent substrate for flat panel display or semiconductor wafer. PECVD is generally accomplished by introducing a precursor gas or gas mixture into a vacuum chamber that contains a substrate disposed on a temperature controlled substrate support (e.g., susceptor). The gas mixture can include reactant gases that combine to form material on the substrate, and inert gases. The precursor gas or gas mixture is typically directed downwardly through a distribution plate situated near the top of the chamber. The gas mixture can be energized or excited into a plasma by applying radio frequency (RF) power to the chamber from one or more RF sources coupled to the chamber, where the excited inert gases can cause sputter etching of the material being formed on the substrate by the reactant gases. Thus, the combination of deposition and etching can be used to fill portions of a device (e.g., a display device) with dielectric material. The deposition rate is directly related to the reactant gas flow rate, and the etch rate is directly related to the inert gas flow rate. However, the ratio between the deposition rate and the etch rate should be controlled to enable controlled dielectric material deposition and removal. This is particularly true as device features become smaller and have higher aspect ratios. To control the reactant gas flow rate and/or the inert gas flow rate, and thus the ratio between the deposition rate and the etch rate, a CVD deposition chamber can utilize a gas delivery system including a gas distribution plate or diffuser that functions to control the distribution of the reactant gases and/or inert gases, and gas lines that direct the reactant gases and/or inert gases into the reactor.

An organic light-emitting diode (OLED) can include anode, a cathode, and an organic light emitting layer between the anode and the cathode. Electron injection and hole injection into the organic light emitting layer can be performed through the cathode and the anode, respectively, in order to generate particles that emit light. An OLED device can be a display device including a number of OLEDs. Some OLED display devices use thin film transistor (TFT) display panels (e.g., the low temperature polysilicon (LTPS) TFT display panels). LTPS TFT display panels contribute to high display device production costs and power consumption. To address the drawbacks of LTPS TFT, low temperature polycrystalline oxide (LTPO) TFT display panels have been developed. The LTPO TFT display panel has similar properties to the LTPS TFT display panel (e.g., similar resolution, response speed, brightness, and aperture ratio), but with improvements to both production cost and power consumption. For example, silicon monoxide (SiO) and/or silicon dioxide ($SiO_2$) (also referred to as silica) thin films can be deposited onto a display substrate to enable OLED surface passivation after the formation of an OLED cathode.

Flat panels for display devices processed by PECVD techniques can be large in area, often exceeding 4 square meters. Diffusers utilized to provide uniform process gas flow over flat panels are relatively large in size, particularly as compared to diffusers utilized for semiconductor device wafer processing. Further, as the substrates used to form display devices are generally rectangular in shape, edges of the substrate, such as sides and corners thereof, experience conditions that may be different than the conditions experienced at other portions of the substrate. These different conditions affect processing parameters such as film thickness, deposition uniformity and/or film stress. Therefore, as the size of flat panel display substrates continues to grow, film thickness and film uniformity control for large area PECVD becomes an issue. For example, the difference of deposition rate and/or film property, such as film thickness or stress, between the center and the edges of the substrate becomes significant.

Aspects and implementations of the present disclosure address these and other shortcomings of existing technologies by providing for deposition chamber diffusers ("diffusers") with increased power efficiency. More specifically, by controlling gas distribution and flow conductance using the diffuser described herein, the activation energy for gas dissociation can be improved under the same RF power. Such increased power efficiency can yield improved film quality (e.g., silicon oxide ($SiO_x$) film quality). Accordingly, the diffusers described herein can enable improved material (e.g., thin film) deposition uniformity and quality.

The diffusers described herein can be implemented within any suitable deposition chamber system. In some embodiments, a diffuser is implemented within a plasma enhanced chemical vapor deposition system (PECVD) configured to process large area substrates (e.g., for fabrication of OLED displays). The material formed by the deposition chamber system can include a dielectric material (e.g., an oxide and/or a nitride). For example, the material can include a dielectric stack including pairs of alternating oxide and nitride layers, where each pair of layers is formed during a particular PECVD cycle. In some embodiments, the oxide layer can include a silicon oxide material (e.g., $SiO_2$) and the nitride layer can include a silicon nitride material (e.g., SiN).

A diffuser described herein can include a number of opening structures formed within a diffuser block. More specifically, after removing material from both a first end of a diffuser block to form a front-side gradient of a diffuser and a second end of the diffuser block to form a back-side gradient of the diffuser, the opening structures can be formed (e.g., drilled) through the front-side surface to the back-side surface. The front-side gradient is a hollow cathode gradient (HCG) that enables the hollow cathode effect (HCE), and the back-side gradient is a gas flow gradient (GFG) that enables gas flow distribution control within the diffuser.

Forming the opening structures can include forming substantially similar sized conical openings through the front-side gradient, and then forming substantially similar sized cylindrical openings through the conical openings. More specifically, the conical openings can be formed having circular base ends positioned at respective locations along the front-side gradient, and pointed ends (apexes) positioned at a substantially same depth within the diffuser block. The cylindrical openings can then be formed through the conical openings such that circular ends of the cylindrical openings are positioned at respective locations along the back-side gradient. Therefore, the opening structures have first ends corresponding to the circular base ends of the conical openings, and second ends corresponding to the circular ends of the cylindrical openings, where the second ends each have a substantially same diameter The first ends of the opening structures collectively provide the diffuser with a hollow cathode gradient (HCG) design for enabling the hollow cathode effect (HCE). That is, the first ends of the opening structures are designed to exploit the hollow cathode effect (HCE) in a manner that controls plasma density and enables uniform plasma density distribution. The second ends of the opening structures collectively provide the diffuser with a global flow gradient (GFG) design for controlling gas flow and enabling uniform gas flow distribution.

The diffuser can have a number of rows of opening structures, where each opening structure of the row is approximately evenly spaced apart. Moreover, if a first row of opening structures includes a first opening structure and a second row of opening structures directly underneath the first row includes a second opening structure, the second opening structure can be in an offset position relative to the first opening structure. For example, if the first opening structure is a first or last opening structure of the first row and the second opening structure is a first or last opening structure of the second row, respectively, then the second opening structure can be at a position corresponding to the midpoint distance between the second end of the first opening structure and an edge of the diffuser. As another example, if the first row further includes a third opening structure having a first end adjacent to the first opening structure, the second opening structure can be at a position corresponding to a midpoint distance between the second ends of the first and second opening structures.

In some embodiments, the distance between the center of the first opening structure and the third opening structure ranges between about 0.2 inch to about 0.65 inch. In some embodiments, the distance between the center of the first opening structure and the third opening structure ranges between about 0.25 inch to about 0.4 inch. In some embodiments, the distance between the center of the first opening structure and the second opening structure ranges between about 0.2 inch to about 0.65 inch. In some embodiments, the distance between the center of the first opening structure and the second opening structure ranges between about 0.25 inch to about 0.4 inch. Furthermore, if a third row of opening structures directly underneath the second row includes a fourth opening structure collinear with the first opening structure, the angle formed by an imaginary line connecting the first opening structure to the second opening structure and an imaginary line connecting the second opening structure to the fourth opening structure (referred to as an "alignment angle") can range between about 100 degrees to about 160 degrees. In some embodiments, the alignment angle ranges between about 120 degrees to about 140 degrees. For example, the alignment angle can be about 130 degrees. In some embodiments, a hole density of the diffuser ranges between about 0.5 hole per square centimeter (cm) to about 3 holes per square cm. In some embodiments, the hole density of the diffuser ranges between about 0.8 hole per square cm to about 1.25 holes per square cm.

FIG. 1 is a cross-sectional view of a deposition chamber system 100 for forming electronic devices, in accordance with some embodiments. In this illustrative embodiment, the system 100 is a PECVD system. However, the system 100 is just an exemplary system that may be used to electronic devices on a substrate, and it contemplated that other deposition chambers may be utilized in accordance with the embodiments described herein.

The chamber 100 generally includes walls 102, a bottom 104, and a gas distribution plate or diffuser 110, and substrate support 130 which define a process volume 206. The process volume 106 is accessed through a sealable slit valve 108 formed through the walls 102 such that the substrate, may be transferred in and out of the chamber 100. The substrate support 130 includes a substrate receiving surface 132 for supporting a substrate 105 and stem 134 coupled to a lift system 136 to raise and lower the substrate support 130. A reactor frame 133 (e.g., mask frame or shadow frame) may be placed over periphery of the substrate 105 during processing. Lift pins 138 are moveably disposed through the substrate support 130 to move the substrate 105 to and from the substrate receiving surface 132 to facilitate substrate transfer. The substrate support 130 may also include heating and/or cooling elements 139 to maintain the substrate support 130 and substrate 105 positioned thereon at a desired temperature. The substrate support 130 may also include grounding straps 131 to provide RF grounding at the periphery of the substrate support 130.

The diffuser 110 is coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 is coupled to the backing plate 112 to provide gas through the backing plate 112 to a plurality of opening structures 111 corresponding to gas passages formed in the diffuser 110 and to the substrate receiving surface 132. A vacuum pump 109 is coupled to the chamber 100 to control the pressure within the process volume 106. An RF power source 122 is coupled to the backing plate 112 and/or to the diffuser 110 to provide RF power to the diffuser 110 to generate an electric field between the diffuser 110 and the substrate support 130 so that a plasma may be formed from the gases present between the diffuser 110 and the substrate support 130. Various RF frequencies may be used, such as a frequency between about 0.3 MHz and about 200 MHz. In one embodiment, the RF power source 122 provides power to the diffuser 110 at a frequency of 13.56 MHz.

A remote power source 124, such as an inductively coupled remote plasma source, may also be coupled between the gas source 126 and the backing plate 112. Between processing substrates, a cleaning gas may be provided to the remote power source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases include but are not limited to $NF_3$, $F_2$, and $SF_6$.

In one embodiment, the heating and/or cooling elements 139 may be utilized to maintain the temperature of the substrate support 130 and substrate 105 thereon during deposition less than about 400 degrees Celsius or less. In one embodiment, the heating and/or cooling elements 139 may be used to control the substrate temperature to less than 100 degrees Celsius, such as between 20 degrees Celsius and about 90 degrees Celsius.

The spacing during deposition between a top surface of the substrate 105 disposed on the substrate receiving surface 132 and a bottom surface 140 of the diffuser 110 may be between 400 mil and about 1,200 mil, for example between 400 mil and about 800 mil. In one embodiment, the bottom surface 140 of the diffuser 110 may include a concave curvature wherein the center region is thinner than a peripheral region thereof, as shown in FIG. 1.

The chamber 100 may be used to deposit silicon oxide ($SiO_x$) with silane ($SiH_4$) gas diluted in nitrous oxide ($N_2O$) by a PECVD process which is widely used as gate insulator films, buffer layers for heat dissipation, interfacial layers, passivation layers, etch stop layers in TFT's and AMO-LED's, etc. The uniformity (i.e., thickness) of the oxide film can impact final device performance, such as mobility and drain current uniformity. A film uniformity of about 5%, or less, across the surface of the substrate, as well as minimal edge exclusion, may be desired. While many strides have been made toward this goal, there are regions of the substrate where this uniformity is not achieved. For example, edges of the substrate, such as corner regions and sides of the substrate, experience a lower deposition rate which results in film thicknesses at these regions that are less than other regions. The cause of the lower deposition rate in the edge regions can be attributed to electromagnetic field variations and/or gas distribution adjacent these areas.

A diffuser 110 has been developed to overcome these effects and minimize non-uniformities in films formed on the substrate 105. Additionally, the diffuser can provide gas flow conductance and distribution that can improve film quality with a more power efficient electromagnetic field under the same RF power. The diffuser 110 includes a number of opening structures formed through a diffuser block, including opening structures 115. As will be described in further detail below, the opening structures can be formed to have first ends corresponding to circular base ends of a conical opening, and second ends corresponding to ends of a cylindrical opening. The first ends are formed along a front-side gradient of the diffuser 110, while the second ends are formed along a back-side gradient of the diffuser 110. The first ends of the opening structures collectively provide the diffuser 110 with a hollow cathode gradient (HCG) design for enabling the hollow cathode effect (HCE). That is, the first ends of the opening structures are designed to exploit the hollow cathode effect (HCE) in a manner that controls plasma density and enables uniform plasma density distribution. The second ends of the opening structures collectively provide the diffuser with a global flow gradient (GFG) design for controlling gas flow and enabling uniform gas flow distribution. Further details regarding the diffuser 110 will now be described below with reference to FIGS. 2-5.

Figure 2:
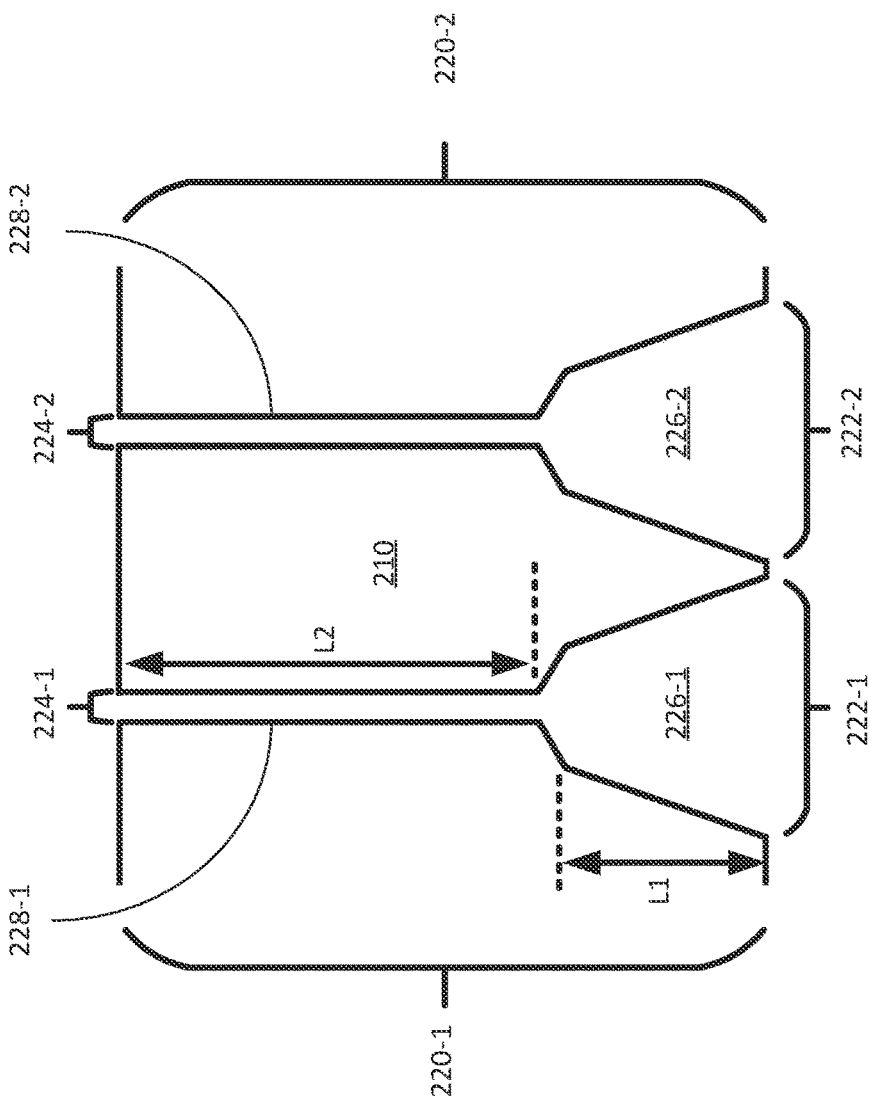
FIG. 2 is a cross-sectional view of a portion of an example diffuser, in accordance with some embodiments.

FIG. 2 is a cross-sectional view of a portion of an example diffuser 200, in accordance with some embodiments. As shown, the diffuser 200 includes a diffuser block 210. The diffuser block 210 can be formed from any suitable material in accordance with embodiments described herein. For example, the diffuser block 210 can include aluminum (Al). The diffuser 210 includes a number of opening structures 220-1 and 220-2 formed through the diffuser block 210. The opening structures 220-1 and 220-2 can have a substantially same geometry. Although 2 opening structures are shown in FIG. 2, the diffuser 200 can have any suitable number of opening structures.

The opening structure 220-1 includes a first end 222-1 and a second end 224-1, and the opening structure 220-2 includes a first end 222-2 and a second end 224-2. Moreover, the opening structure 220-1 includes a conical opening portion 226-1 and a cylindrical opening portion 228-1, and the opening structure 220-2 includes a conical opening portion 226-2 and a cylindrical opening portion 228-2. That is, the first ends 222-1 and 222-2 of the opening structures 220-1 and 220-2 correspond to circular base ends of the conical opening portions 226-1 and 226-2, respectively, and the second ends 224-1 and 224-2 of the opening structures 220-1 and 220-2 correspond to ends of the cylindrical opening portions 228-1 and 228-2, respectively. For simplicity, neither a front-side gradient nor a back-side gradient are shown. However, as will now be described in further detail below with reference to FIGS. 3A-3E, the diffuser 200 can have a front-side gradient to enable uniform plasma density distribution and a back-side gradient to enable uniform gas flow control.

In some embodiments, the widths of the first ends 222-1 and 222-2 corresponding to the diameters of the conical opening portions 226-1 and 226-2, respectively, range from about 0.3 inch to about 0.5 inch. In some embodiments, the widths of the second ends 224-1 and 224-2 corresponding to the diameters of the cylindrical opening portions 228-1 and 228-2, respectively, range from about 0.035 inch to about 0.055 inch. The conical opening portions 226-1 and 226-2 can have a length "L1". In some embodiments, the length L1 ranges from about 0.2 inch to about 0.65 inch. The cylindrical opening portions 228-1 and 228-2 can have a length "L2". In some embodiments, the length L2 ranges from about 0.9 inch to about 1.2 inches.

Figure 3D:
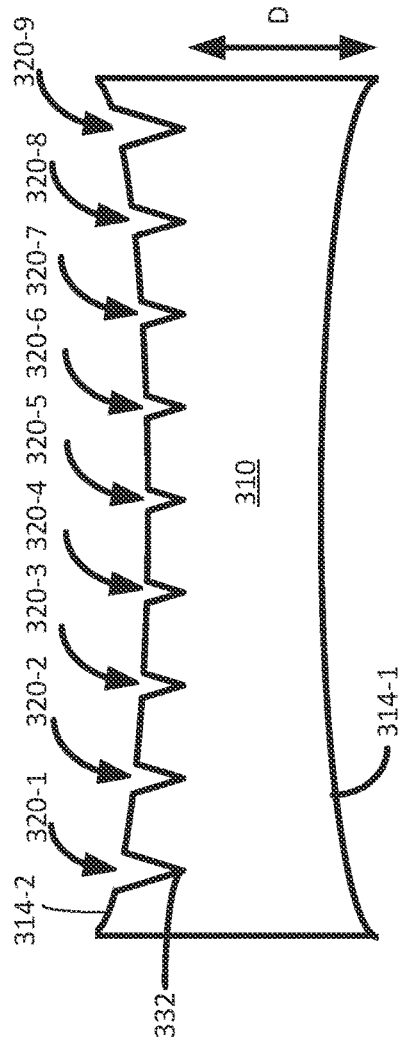

FIGS. 3A-3E are cross-sectional views illustrating an example process flow for fabricating a diffuser 300, in accordance with some embodiments. FIG. 3A shows a diffuser block 310 having a first side 312-1 and a second side 312-2 opposite the first side 312-1. The diffuser block 310 can be similar to the diffuser block 210 of FIG. 2.

FIG. 3B shows the removal or "scooping" of material from the first side 312-1 to form a back-side gradient surface 314-1 associated with a back-side gradient (e.g., GFG). The back-side gradient surface 314-1 corresponds to a concave surface created within the first side 312-1. The material can be removed using any suitable process. After the back-side gradient surface 314-1 is formed, the diffuser block 310 can be cleaned and flipped (e.g., rotated 180 degrees) so that the second side 312-2 is exposed for processing.

FIG. 3C shows the removal or "scooping" of material from the second side 312-2 to form a front-side gradient surface 314-2 associated with a front-side gradient (e.g., HCG). Similar to the back-side gradient surface 314-1, the front-side gradient surface 314-2 corresponds to a concave surface created within the second side 312-2. The material can be removed using any suitable process.

FIG. 3D shows the formation of a number of conical openings 320-1 through 320-9 through the front-side gradient surface 314-2. For example, the conical openings 320-1 through 320-9 can be drilled. Although 9 conical openings 320-1 through 320-9 are shown in FIG. 3D, the number of conical openings should not be considered limiting. Each of the conical openings 320-1 through 320-9 has a pointed edge or apex formed to an approximately same depth "D" within the diffuser block 310 (e.g., apex 332 of the conical opening 330-1). In some embodiments, the depth D ranges from about 0.35 inch to about 0.65 inch. In some embodiments, the depth D ranges from about 0.45 inch to about 0.55 inch. Although the apex of each of the conical openings 320-1 through 320-9 is formed to the approximately same depth D, the geometry of the conical openings 320-1 through 320-9 varies as a function of the front-side gradient surface 314-2. More specifically, the conical openings corresponding to the edges of the diffuser 300 (conical openings 330-1 and 330-9) are the longest conical openings having the greatest length, while the conical opening at the center of the diffuser 300 (conical opening 330-5) is the shortest conical opening having the smallest length.

Figure 3E:
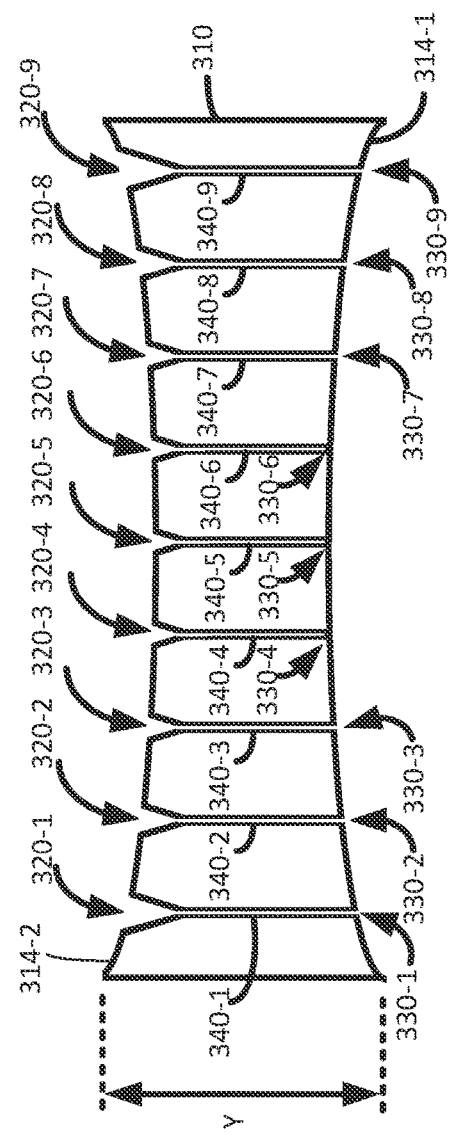

FIG. 3E shows the formation of a number of cylindrical openings 330-1 through 330-9 through respective ones of the conical openings 320-1 through 320-9. For example, the cylindrical openings 330-1 through 330-9 can be drilled. Each of the cylindrical openings 330-1 through 330-9 begins from the apex of its corresponding one of the conical openings 320-1 through 320-9, and terminates at the back-side gradient 314-2. Although each of the conical openings 320-1 through 320-9 is formed starting from the approximately same depth D, the geometry of the cylindrical openings 330-1 through 330-9 varies as a function of the back-side gradient surface 314-1. More specifically, similar to the conical openings 320-1 through 320-9, the cylindrical openings corresponding to the edges of the diffuser 300 (cylindrical openings 330-4 and 330-4) are the longest cylindrical openings, while the cylindrical opening at the center of the diffuser 330 (cylindrical opening 330-4) is the shortest conical opening. The cylindrical openings 320-1 through 320-9 and the respective conical openings 330-1 through 330-9 collectively form a number of opening structures 340-1 through 340-9, respectively.

The geometry of the conical openings 320-1 through 320-9 with respect to the front-side gradient supports the hollow cathode effect (HCE) and enables improved control and uniformity of plasma density distribution. For example, each of the conical openings 320-1 through 320-9 has a respective conical length defined by the front-side gradient surface. The geometry of the cylindrical openings 330-1 through 330-9 with respect to the back-side gradient creates a global flow gradient (GFG) that can enable gas flow distribution and material deposition. For example, each of the cylindrical openings 330-1 through 330-9 has a respective cylindrical length defined by the back-side gradient surface.

As further shown, the diffuser 300 can have a height "Y". In some embodiments, the height Y ranges from about 1 inch to about 2 inches. For example, the height Y can be about 1.4 inches. In some embodiments, the ratio of L1 (from FIG. 2) to Y ranges from about 0.55 to about 0.9. In some embodiments, the ratio of L1 to Y ranges from about 0.6 to about 0.7. In some embodiments, the ratio of L2 (from FIG. 2) to Y ranges from about 0.2 to about 0.4.

Figure 4:
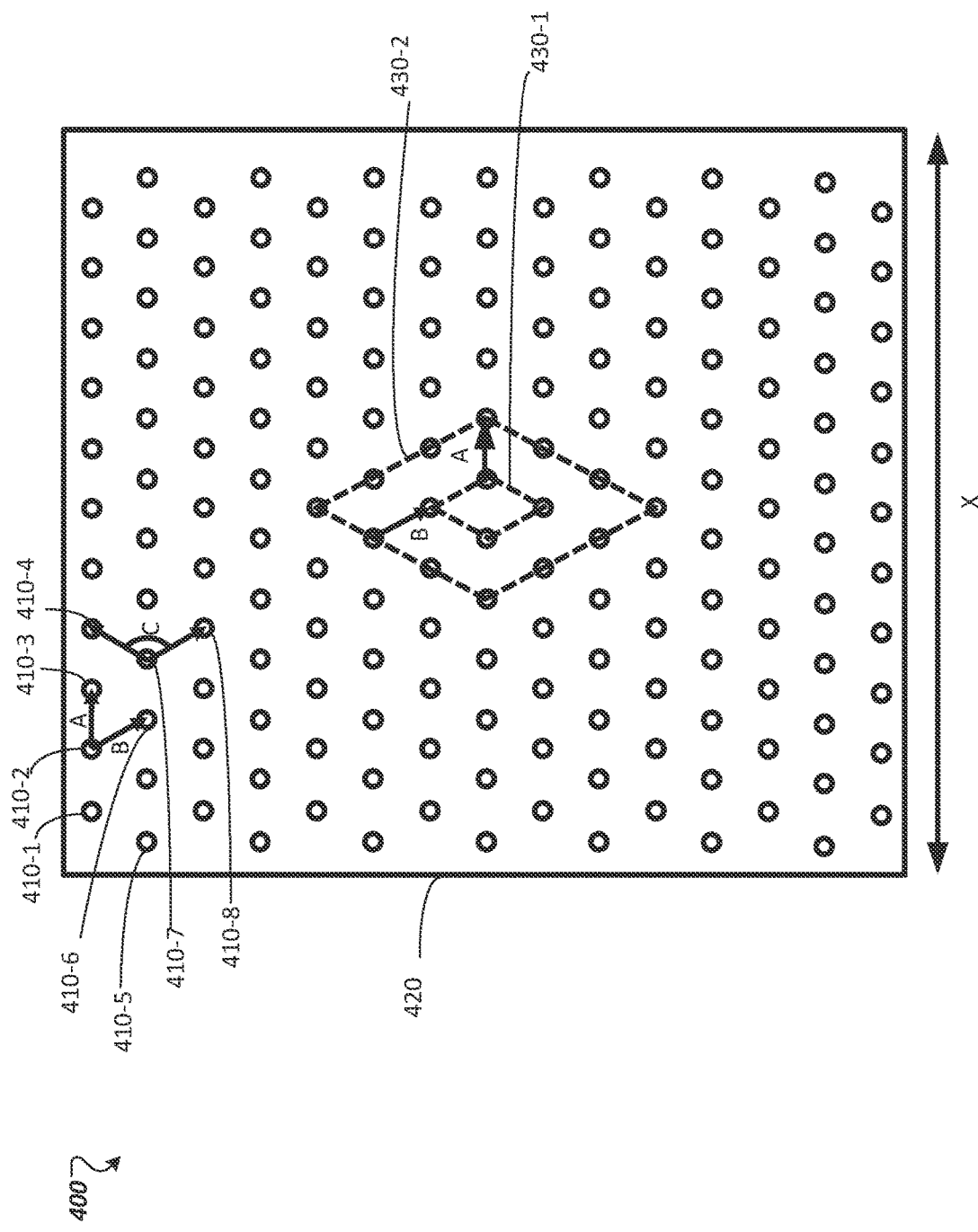
FIG. 4 is a top-down view of an example diffuser, in accordance with some embodiments.

FIG. 4 is a top-down view of an example diffuser 400, in accordance with some embodiments. For example, the top-down view shows a back-side of the diffuser 400. As shown, the diffuser 400 includes a number of opening structures including opening structures 410-1 through 410-8. The opening structures are uniformly arranged in a number of rows. More specifically, the opening structures are arranged into a first set of rows and a second set of rows alternately positioned along a length of the diffuser block. For example, the first set of rows can include "odd" numbered rows, and the second set of rows can include "even" numbered rows (or vice versa). For example, opening structures 410-1 through 410-4 are located in a first row corresponding to the first set of rows, opening structures 410-5 through 410-7 are located in a second row corresponding to the second set of rows, and opening structure 410-8 is located in a third row corresponding to the first set of rows.

Each opening structure in a particular row is evenly spaced apart by an approximately same distance "A" as measured from the centers of the ends of the cylindrical openings of the opening structures. For example, in FIG. 4, opening structures 410-1 and 410-2 are separated by the distance A. However, opening structures 410-2 and 410-3 are also separated by the distance A, as well as opening structures 410-3 and 410-4, opening structures 410-5 and 410-6, opening structures 410-6 and 410-7, etc. In some embodiments, the distance A ranges from about 0.2 inch to about 0.65 inch. In some embodiments, the distance A ranges from about 0.25 inch to about 0.4 inch.

Moreover, if a first row of opening structures includes a first opening structure and a second row of opening structures directly underneath the first row includes a second opening structure, the second opening structure can be in an offset position relative to the first opening structure. For example, the opening structure 410-5 in the second row can be at a position corresponding to the midpoint distance between the opening structure 410-1 and the edge 420 of the diffuser 400. As another example, the opening structure 410-6 can be at a position corresponding to a midpoint distance between the opening structures 410-2 and 410-3. As further shown, the opening structure 410-2 and the opening structure 410-6 are spaced apart by a distance "B" as measured from the centers of the ends of the cylindrical openings of the opening structures 410-2 and 410-6. In some embodiments, the distance B rages from about 0.2 inch to about 0.65 inch. In some embodiments, the distance B ranges from about 0.25 inch to about 0.4 inch. Similarly, opening structures 410-1 and 410-5 are spaced apart by approximately the same distance B, etc.

As further shown, an angle "C" is formed between the line connecting the centers of the opening structures 410-7 and 410-4 and the line connecting the centers of the opening structures 410-7 and 410-8. The angle C is referred to herein as an "alignment angle." In some embodiments, the angle C ranges from about 100 degrees to about 160 degrees. In some embodiments, the angle C ranges between about 120 degrees to about 140 degrees. For example, the angle C can be about 130 degrees. Groupings of the opening structures of the diffuser 400 can form respective rhombus (e.g., diamond or kite) patterns that extend outward from the center of the diffuser. For example, the rhombus patterns can include a rhombus pattern 430-1 and a rhombus pattern 430-2.

The opening structures of the diffuser 400 are uniformly distributed throughout the diffuser block. In some embodiments, a hole density of the diffuser 400 ranges between about 0.5 hole per square cm to about 3 holes per square cm. In some embodiments, the hole density of the diffuser 400 ranges between about 0.8 hole per square cm to about 1.25 holes per square cm. A linear relation can exist between cylindrical opening length and flow conductance with respect to the opening structures throughout the diffuser 400 (e.g., from the edges of the diffuser 400 to the center of the diffuser 400).

As further shown, the diffuser 400 can have a length "X". In some embodiments, the length X can range from about 110 inches to about 115 inches. For example, the length X can be about 113 inches. In some embodiments, the ratio of A to X ranges from about 0.15 to about 0.4. In some embodiments, the ratio of A to X ranges from about 0.25 to about 0.35. In some embodiments, the ratio of B to X ranges from about 0.15 to about 0.4. In some embodiments, the ratio of B to X ranges from about 0.25 to about 0.35. In some embodiments, the ratio of the diameters of the cylindrical openings (e.g., the widths of the openings 224-1 and 224-2 of FIG. 2) to X ranges from about 0.03% to about 0.05%. In some embodiments, the ratio of the diameters of the conical openings (e.g., the widths of the openings 226-1 and 226-2 of FIG. 2) ranges from about 0.25 to about 0.45. In some embodiments, the ratio of the diameters of the conical openings ranges from about 0.3 to about 0.4.

Figure 5:
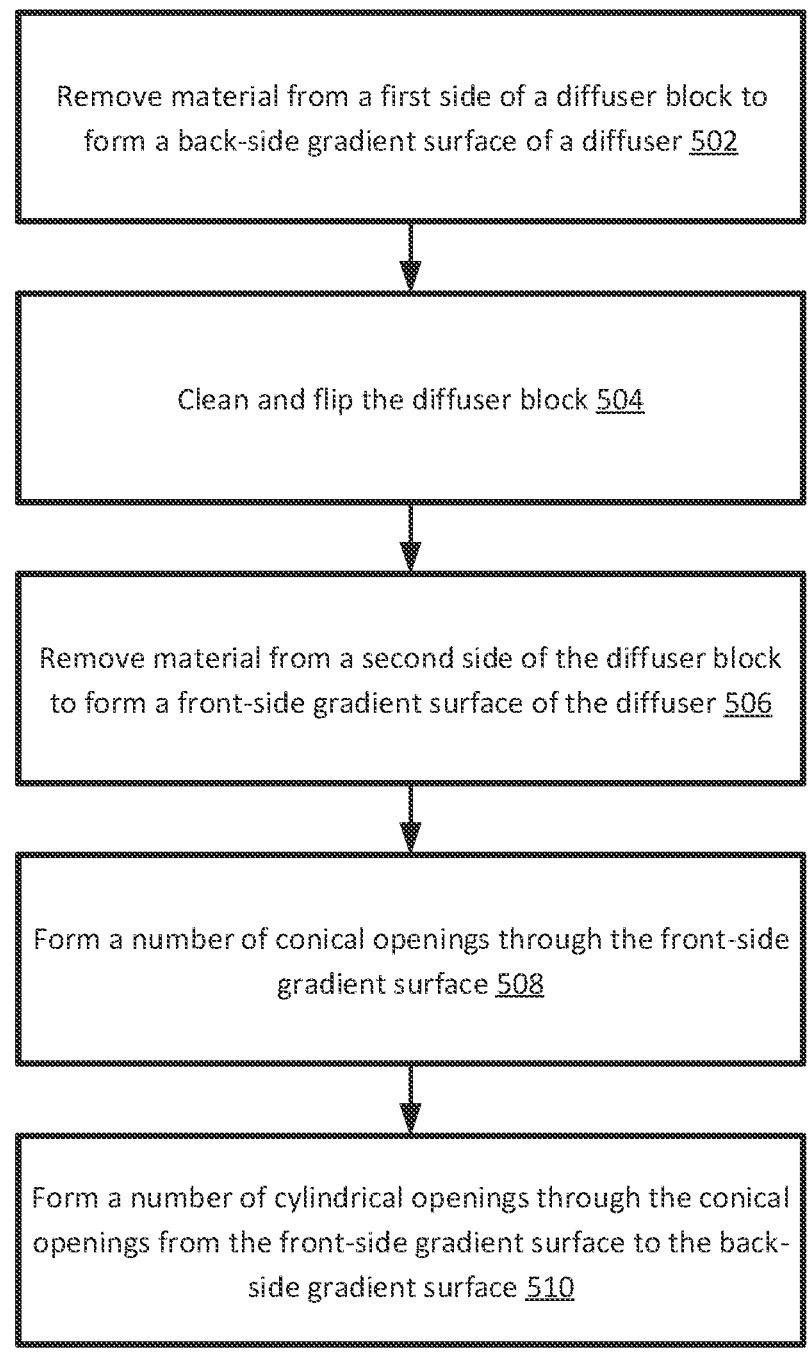
FIG. 5 is a flow chart of an example method for fabricating a diffuser, in accordance with some embodiments.

FIG. 5 depicts a flow chart of an example method 500 for fabricating a diffuser, in accordance with some embodiments. The diffuser can be included within a deposition chamber system to enable uniform material deposition (e.g., uniform process gas flow mixing).

At block 502, material is removed from a first side of a diffuser block to form a back-side gradient surface of a diffuser. The back-side gradient surface is associated with a back-side gradient (e.g., GFG). The back-side gradient surface corresponds to a concave surface created within the first side of the diffuser block. The material can be removed using any suitable process.

At block 504, the diffuser block is cleaned and flipped. More specifically, the diffuser block can be rotated 180 degrees). Any suitable cleaning process can be used to clean the diffuser block in accordance with embodiments described herein.

At block 506, material is removed from a second side of the diffuser block to form a front-side gradient of the diffuser. The front-side gradient is associated with a front-side gradient (e.g., HCG). The front-side gradient surface corresponds to a concave surface created within the second side of the diffuser block. The material can be removed using any suitable process.

At block 508, a number of conical openings are formed through the front-side gradient. For example, the conical openings can be drilled. Each of the conical openings has a pointed edge or apex formed to an approximately same depth within the diffuser block. In some embodiments, the depth ranges from about 0.35 inch to about 0.65 inch. In some embodiments, the depth ranges from about 0.45 inch to about 0.55 inch. Although the apex of each of the conical openings is formed to an approximately same depth, the geometry of the conical openings varies as a function of the front-side gradient. More specifically, the conical openings corresponding to the edges of the diffuser are the longest conical openings, while the conical opening at the center of the diffuser is the shortest conical opening.

At block 510, a number of cylindrical openings are formed through the conical openings from the front-side gradient to the back-side gradient. For example, the cylindrical openings can be drilled. Each of the cylindrical openings begins from the apex of its corresponding cylindrical opening, and terminates at the back-side gradient surface. Although the apex of each of the conical openings is formed to an approximately same depth, the geometry of the cylindrical openings varies as a function of the back-side gradient surface. More specifically, similar to the cylindrical openings, the cylindrical openings corresponding to the edges of the diffuser are the longest cylindrical openings, while the cylindrical opening at the center of the diffuser is the shortest conical opening. The cylindrical openings and the respective conical openings collectively form a number of opening structures.

Figure 6:
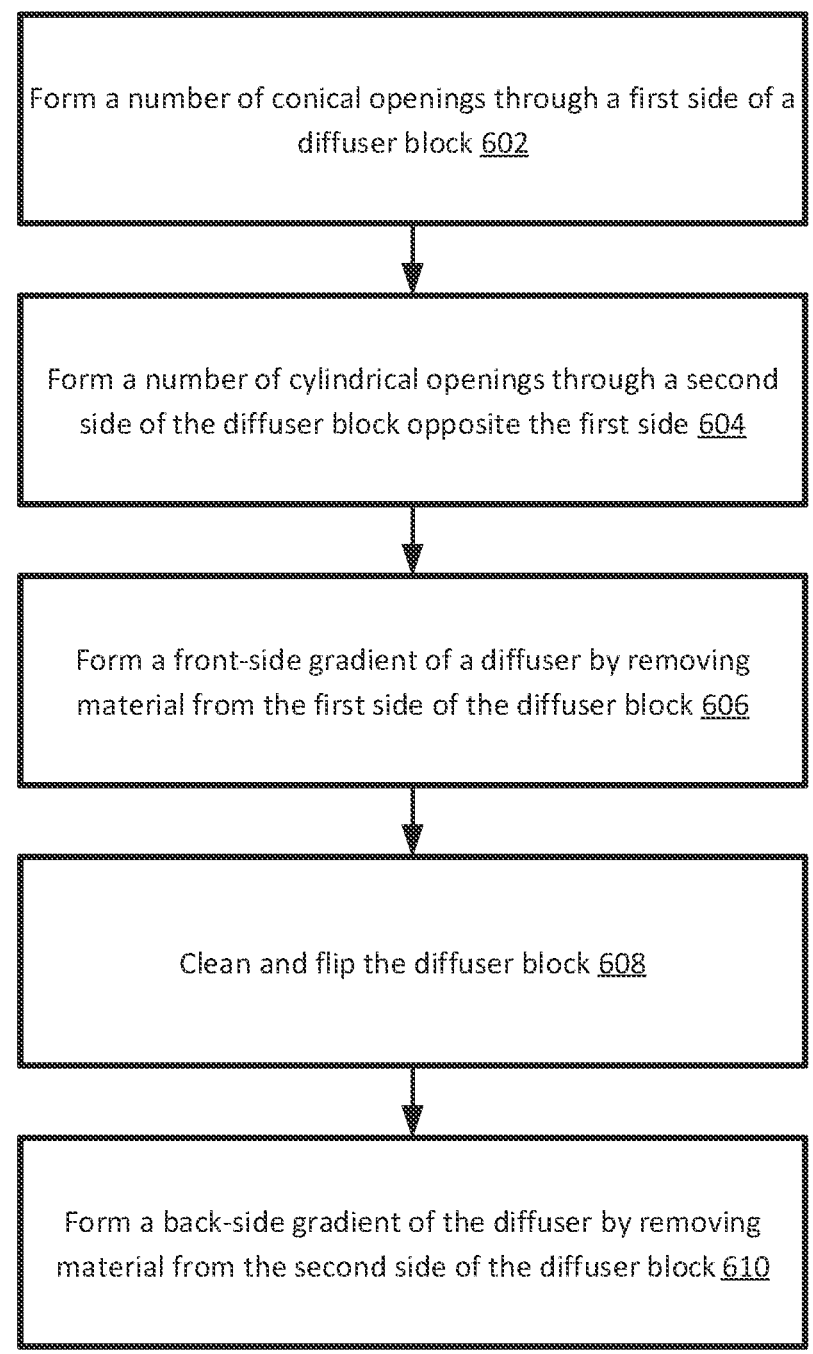
FIG. 6 is a flow chart of an example method for fabricating a diffuser, in accordance with some embodiments.

FIG. 6 depicts a flow chart of an example method 600 for fabricating a diffuser, in accordance with some embodiments. The diffuser can be included within a deposition chamber system to enable uniform material deposition (e.g., uniform process gas flow mixing).

At block 602, a number of conical openings are formed through a first side of a diffuser block. For example, the conical openings can be drilled. Each of the conical openings has a pointed edge or apex formed to an approximately same depth within the diffuser block. In some embodiments, the depth ranges from about 0.35 inch to about 0.65 inch. In some embodiments, the depth ranges from about 0.45 inch to about 0.55 inch.

At block 604, a number of cylindrical openings are formed through the conical openings from the first side of the diffuser block to a second side of the diffuser block opposite the first side. For example, the cylindrical openings can be drilled. Each of the cylindrical openings begins from the apex of its corresponding cylindrical opening, and terminates at the second side of the diffuser block.

At block 606, a front-side gradient of a diffuser is formed by removing material from the first side of the diffuser block. The front-side gradient is associated with a front-side gradient (e.g., HCG). The front-side gradient surface corresponds to a concave surface created within the second side of the diffuser block. The material can be removed using any suitable process.

At block 608, the diffuser block is cleaned and flipped. More specifically, the diffuser block can be rotated 180 degrees). Any suitable cleaning process can be used to clean the diffuser block in accordance with embodiments described herein.

At block 610, a back-side gradient of the diffuser is formed by removing material from the second side of the diffuser block. The back-side gradient surface is associated with a back-side gradient (e.g., GFG). The back-side gradient surface corresponds to a concave surface created within the first side of the diffuser block. The material can be removed using any suitable process. In some embodiments, the back-side gradient is formed prior to the front-side gradient, such that the operations performed at blocks 606 and 610 are swapped.

After the formation of the front-side gradient and the back-side gradient, the cylindrical openings and the respective conical openings collectively form a number of opening structures of the diffuser. Although the apex of each of the conical openings is formed to an approximately same depth, the geometry of the conical openings varies as a function of the front-side gradient and the geometry of the cylindrical openings varies as a function of the back-side gradient. More specifically, the conical openings corresponding to the edges of the diffuser are the longest conical openings, while the conical opening at the center of the diffuser is the shortest conical opening, and the cylindrical openings corresponding to the edges of the diffuser are the longest cylindrical openings, while the cylindrical opening at the center of the diffuser is the shortest conical opening.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A diffuser comprising:
   a front-side gradient surface corresponding to a first concave surface formed from a diffuser block;
   a back-side gradient surface corresponding to a second concave surface formed from the diffuser block; and
   a plurality of opening structures formed from the front-side gradient surface to the back-side gradient surface, wherein each opening structure of the plurality of opening structures comprises:
     a conical opening having a first end along the front-side gradient surface and a second end corresponding to an apex at an approximately same depth within the diffuser block, wherein the conical opening has a respective conical length defined by the front-side gradient surface; and
     a cylindrical opening of approximately constant diameter formed from the approximately same depth to the back-side gradient surface, wherein the cylindrical opening has a respective cylindrical length defined by the back-side gradient surface;
   wherein the plurality of opening structures is arranged in a plurality of rows comprising a first set of rows and a second set of rows alternately positioned along a length of the diffuser block, wherein the first set of rows comprises a first row having a first opening structure and a second opening structure separated by a first distance measured between centers of the first and second opening structures, wherein the second set of rows comprises a second row having a third opening structure separated from the first opening structure by a second distance measured between centers of the first and third opening structures, and wherein the diffuser has a hole density corresponding to the plurality of opening structures that ranges between about 0.8 hole per square centimeter to about 1.25 holes per square centimeter.

2. The diffuser of claim 1, wherein the first distance and the second distance each range from about 0.2 inch to about 0.65 inch.

3. The diffuser of claim 1, wherein the approximately constant diameter of the cylindrical opening has a diameter ranging from about 0.035 inch to about 0.055 inch, and wherein the respective cylindrical length ranges from about 0.9 inch to about 1.2 inches.

4. The diffuser of claim 1, wherein the third opening structure is at a position corresponding to a midpoint distance between the first and second opening structures, or a position corresponding to a midpoint distance between the first opening structure and an edge of the diffuser.

5. The diffuser of claim 1, wherein the plurality of rows further comprises a third row having a fourth opening structure, and wherein an alignment angle defined between the first opening structure, the third opening structure and the fourth opening structure is about 130 degrees.

6. The diffuser of claim 1, wherein the approximately same depth ranges from about 0.45 inch to about 0.55 inch.

7. A deposition chamber system comprising:
   a processing chamber;
   at least one gas source; and
   a diffuser disposed within the processing chamber to receive a gas flow from the at least one gas source, wherein the diffuser comprises:
     a front-side gradient surface corresponding to a first concave surface formed from a diffuser block;
     a back-side gradient surface corresponding to a second concave surface formed from the diffuser block; and
     a plurality of opening structures formed from the front-side gradient surface to the back-side gradient surface, wherein each opening structure of the plurality of opening structures comprises:
       a conical opening having a first end along the front-side gradient surface and a second end corresponding to an apex at an approximately same depth within the diffuser block, wherein the conical opening has a respective conical length defined by the front-side gradient surface; and
       a cylindrical opening of approximately constant diameter formed from the approximately same depth to the back-side gradient surface, wherein the cylindrical opening has a respective cylindrical length defined by the back-side gradient surface;
     wherein the plurality of opening structures is arranged in a plurality of rows comprising a first set of rows and a second set of rows alternately positioned along a length of the diffuser block, wherein the first set of rows comprises a first row having a first opening structure and a second opening structure separated by a first distance measured between centers of the first and second opening structures, wherein the second set of rows comprises a second row having a third opening structure separated from the first opening structure by a second distance measured between centers of the first and third opening structures, and wherein the diffuser has a hole density corresponding to the plurality of opening structures that ranges between about 0.8 hole per square centimeter to about 1.25 holes per square centimeter.

8. The deposition chamber system of claim 7, wherein the first distance and the second distance each range from about 0.2 inch to about 0.65 inch.

9. The deposition chamber system of claim 7, wherein the approximately constant diameter of the cylindrical opening has a diameter ranging from about 0.035 inch to about 0.055 inch, and wherein the respective cylindrical a length ranges from about 0.9 inch to about 1.2 inches.

10. The deposition chamber system of claim 7, wherein the third opening structure is at a position corresponding to a midpoint distance between the first and second opening structures, or a position corresponding to a midpoint distance between the first opening structure and an edge of the diffuser.

11. The deposition chamber system of claim 7, wherein the plurality of rows further comprises a third row having a fourth opening structure, and wherein an alignment angle defined between the first opening structure, the third opening structure and the fourth opening structure is about 130 degrees.

12. The deposition chamber system of claim 7, wherein the approximately same depth ranges from about 0.45 inch to about 0.55 inch.

13. A diffuser comprising:
- a front-side gradient surface corresponding to a first concave surface formed from a diffuser block;
- a back-side gradient surface corresponding to a second concave surface formed from the diffuser block; and
- a plurality of opening structures formed from the front-side gradient surface to the back-side gradient surface, wherein each opening structure of the plurality of opening structures comprises:
  - a conical opening having a first end along the front-side gradient surface and a second end corresponding to an apex at an approximately same depth within the diffuser block, wherein the conical opening has a respective conical length defined by the front-side gradient surface; and
  - a cylindrical opening of approximately constant diameter formed from the approximately same depth to the back-side gradient surface, wherein the cylindrical opening has a respective cylindrical length defined by the back-side gradient surface wherein the diffuser has a hole density corresponding to the plurality of opening structures that ranges between about 0.8 hole per square centimeter to about 1.25 holes per square centimeter.

14. The diffuser of claim 13, wherein the approximately constant diameter of the cylindrical opening has a diameter ranging from about 0.035 inch to about 0.055 inch, and wherein the respective cylindrical length ranges from about 0.9 inch to about 1.2 inches.

15. The diffuser of claim 13, wherein the approximately same depth ranges from about 0.45 inch to about 0.55 inch.

* * * * *